United States Patent
Dufresne et al.

(10) Patent No.: US 10,149,402 B1
(45) Date of Patent: Dec. 4, 2018

(54) RACK-MOUNTABLE IT DEVICE

(71) Applicant: EMC CORPORATION, Hopkinton, MA (US)

(72) Inventors: Daniel Dufresne, Salem, NH (US); James L. Pringle, Jr., Pelham, NH (US)

(73) Assignee: EMC IP Holding Company LLC, Hopkinton, MA (US)

( * ) Notice: Subject to any disclaimer, the term of this patent is extended or adjusted under 35 U.S.C. 154(b) by 31 days.

(21) Appl. No.: 14/871,530

(22) Filed: Sep. 30, 2015

(51) Int. Cl.
*H05K 7/14* (2006.01)
*G06F 13/40* (2006.01)

(52) U.S. Cl.
CPC ....... *H05K 7/1492* (2013.01); *G06F 13/4068* (2013.01); *H05K 7/1401* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 7,525,797 B2 * | 4/2009 | Coglitore | ................. | G06F 1/18 361/679.46 |
| 7,684,961 B1 * | 3/2010 | Robillard | ............... | G06F 11/326 702/183 |
| 8,126,904 B1 * | 2/2012 | Bettinger | ............... | G06Q 10/06 707/609 |
| 9,131,624 B1 * | 9/2015 | Johnson | ................ | H05K 7/1489 |
| 9,699,932 B2 * | 7/2017 | Eberle, Jr. | ............ | H05K 7/1489 |
| 9,851,764 B2 * | 12/2017 | Harvilchuck | ........... | G06F 1/185 |
| 2007/0018546 A1 * | 1/2007 | Bridges | ................. | G11B 33/12 312/330.1 |
| 2007/0070612 A1 * | 3/2007 | Coutancier | .......... | H05K 7/1489 361/797 |
| 2010/0149737 A1 * | 6/2010 | Shtargot | ................. | G06F 1/183 361/679.02 |
| 2011/0228473 A1 * | 9/2011 | Anderson | ............ | G02B 6/4452 361/679.58 |
| 2012/0281373 A1 * | 11/2012 | Bohannon | ............ | H05K 7/1489 361/756 |
| 2013/0068706 A1 * | 3/2013 | Chen | ..................... | H05K 7/1489 211/26 |
| 2013/0163218 A1 * | 6/2013 | Kostecka | ............... | H05K 7/005 361/807 |
| 2016/0073544 A1 * | 3/2016 | Heyd | .................... | G11B 33/128 361/679.31 |
| 2016/0165743 A1 * | 6/2016 | Milligan | ............... | H05K 7/1409 361/679.31 |
| 2016/0219747 A1 * | 7/2016 | Genest | ................. | H05K 7/1487 |

(Continued)

*Primary Examiner* — Binh Tran
*Assistant Examiner* — Douglas Burtner
(74) *Attorney, Agent, or Firm* — Brian J. Colandreo; Mark H. Whittenberger; Holland & Knight LLP

(57) ABSTRACT

An IO subsystem, for use with an IT computing device, includes a cage assembly configured to releasably engage a chassis of the IT computing device and to receive a plurality of IO adapter cards. A midplane adapter assembly, positioned within the cage assembly, includes a first electrical connector system configured to engage a generic connector system included within the IT computing device and a second electrical connector system configured to engage the plurality of IO adapter cards. A coupling system is configured to releasably couple the cage assembly to the chassis of the IT computing device.

14 Claims, 6 Drawing Sheets

(56) References Cited

U.S. PATENT DOCUMENTS

| | | | | |
|---|---|---|---|---|
| 2016/0227666 A1* | 8/2016 | Chen | | H05K 7/1489 |
| 2016/0278232 A1* | 9/2016 | Chen | | H05K 7/1489 |
| 2016/0278234 A1* | 9/2016 | Chen | | H05K 7/1489 |
| 2016/0278522 A1* | 9/2016 | Chen | | H05K 7/1489 |
| 2016/0286683 A1* | 9/2016 | Chen | | H05K 7/1489 |
| 2016/0296016 A1* | 10/2016 | Chen | | H05K 7/1489 |
| 2016/0296017 A1* | 10/2016 | Chen | | A47B 88/49 |
| 2016/0331136 A1* | 11/2016 | Chen | | H05K 7/1489 |
| 2016/0363965 A1* | 12/2016 | Hsu | | G06F 1/182 |
| 2016/0369844 A1* | 12/2016 | Ito | | A47B 88/493 |
| 2017/0064859 A1* | 3/2017 | Chen | | H05K 7/1488 |
| 2017/0071072 A1* | 3/2017 | Adams | | H05K 7/1489 |
| 2017/0205857 A1* | 7/2017 | Moore | | G06F 1/187 |
| 2017/0257971 A1* | 9/2017 | Eberle, Jr. | | H05K 7/1489 |

* cited by examiner

FIG. 2A (front view)

RACK-MOUNTABLE IT DEVICE

TECHNICAL FIELD

This disclosure relates to IT devices and, more particularly, to rack-mountable IT devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT devices are mounted within IT racks and need to be serviced in the field. Naturally, as times change, the requirements of these IT devices may change also. Unfortunately, as these IT devices are typically monolithic in design, they are often incapable of accommodating such changes.

SUMMARY OF DISCLOSURE

In one implementation, an IO subsystem, for use with an IT computing device, includes a cage assembly configured to releasably engage a chassis of the IT computing device and to receive a plurality of IO adapter cards. A midplane adapter assembly, positioned within the cage assembly, includes a first electrical connector system configured to engage a generic connector system included within the IT computing device and a second electrical connector system configured to engage the plurality of IO adapter cards. A coupling system is configured to releasably couple the cage assembly to the chassis of the IT computing device.

One or more of the following features may be included. The coupling system may include one or more lever assemblies. The coupling system may include one or more screw assemblies. The coupling system may include one or more latching assemblies. The IO subsystem may be configured to couple the IT computing device to a network infrastructure. The network infrastructure may include one or more of: an Ethernet infrastructure; a fiber channel infrastructure; and an infiniband infrastructure. The IT computing device may include a processing component configured to include one or more microprocessors. The IT computing device may include a storage component configured to include one or more storage devices. The one or more storage devices may include at least one hard disk drive. The one or more storage devices may include at least one solid state storage device. The IT computing device may be a 2U IT computing device.

In another implementation, an IO subsystem, for use with an IT computing device, includes a cage assembly configured to releasably engage a chassis of the IT computing device and to receive a plurality of IO adapter cards. A midplane adapter assembly, positioned within the cage assembly, includes a first electrical connector system configured to engage a generic connector system included within the IT computing device and a second electrical connector system configured to engage the plurality of IO adapter cards. A coupling system is configured to releasably couple the cage assembly to the chassis of the IT computing device. The IO subsystem is configured to couple the IT computing device to a network infrastructure, including one or more of an Ethernet infrastructure, a fiber channel infrastructure, and an infiniband infrastructure.

One or more of the following features may be included. The coupling system may include one or more lever assemblies. The coupling system may include one or more screw assemblies. The coupling system may include one or more latching assemblies. The IT computing device may include a processing component configured to include one or more microprocessors. The IT computing device may include a storage component configured to include one or more storage devices.

In another implementations, an IO subsystem, for use with an IT computing device, includes a cage assembly configured to releasably engage a chassis of the IT computing device and to receive a plurality of IO adapter cards. A midplane adapter assembly, positioned within the cage assembly, includes a first electrical connector system configured to engage a generic connector system included within the IT computing device and a second electrical connector system configured to engage the plurality of IO adapter cards. A coupling system is configured to releasably couple the cage assembly to the chassis of the IT computing device. The IT computing device includes: a processing component configured to include one or more microprocessors, and a storage component configured to include one or more storage devices.

One or more of the following features may be included. The one or more storage devices may include at least one hard disk drive. The one or more storage devices may include at least one solid state storage device.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a diagrammatic front view of the IT computing device of FIG. 1;

Like reference symbols in the various drawings indicate like elements.

DETAILED DESCRIPTION OF THE PREFERRED EMBODIMENTS

Figure 1:
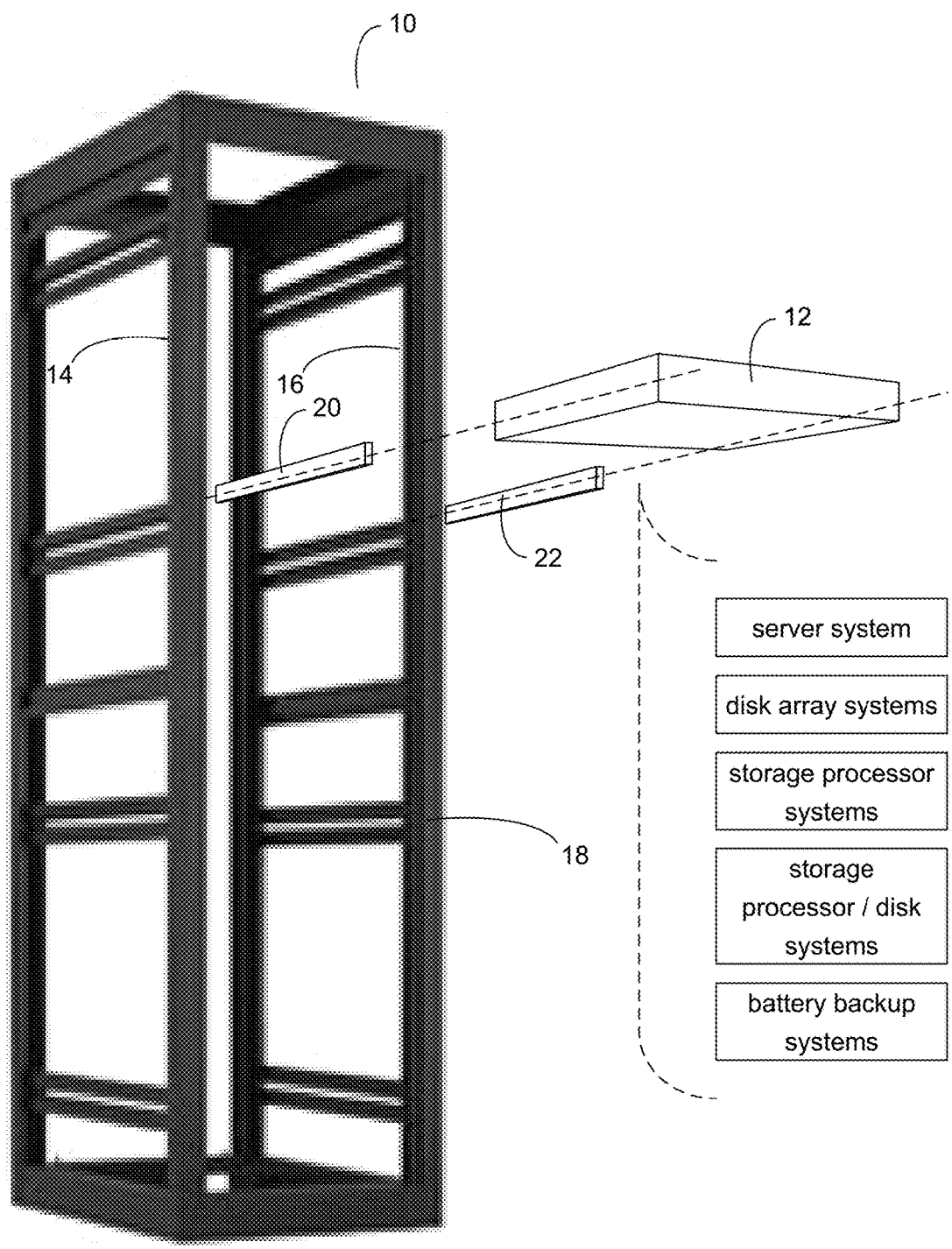
FIG. 1 is a perspective view of an IT rack and an IT computing device.

Referring to FIG. 1, IT racks (e.g., IT rack 10) may be utilized to store and organize IT devices. For example, IT rack 10 may be placed within a computer room and various IT devices (e.g., IT computing device 12) may be attached to rails (e.g., NEMA rails 14, 16) included within IT rack 10, wherein these rails (e.g., NEMA rails 14, 16) may have a standard and defined spacing between them (e.g., 19"). Typically, IT devices that are configured to fit within IT rack 10 may be described as rack-mountable IT devices.

Examples of the various IT devices (e.g., IT computing device 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT devices within IT rack 10. By standardizing the spacing between NEMA rails 14, 16, the various IT devices that fit within a first IT rack may also fit within a second IT rack.

Typically, IT racks are defined in accordance with the number of rack units (U's) included within the rack. For example, a 1U IT device is half as high as a 2U IT device, which is half as high as a 4U IT device. Accordingly, while the number of rack units available within a particular IT rack may be rigidly defined by the size of the IT rack, the number of IT devices mountable within that IT rack may vary depending upon the size (in rack units) of the particular IT devices being mounted within that IT rack. Therefore, by reducing the number of rack units that a particular IT device uses within an IT rack, additional IT computing devices may be mounted within the IT rack.

Figure 1A:
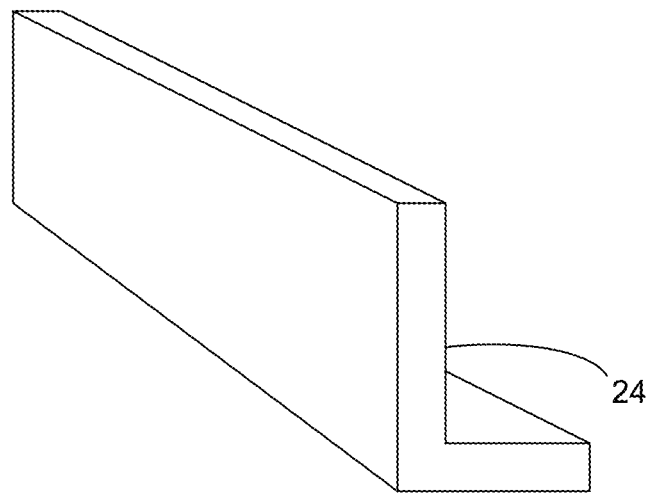
FIGS. 1A-1B are diagrammatic views of track assemblies usable within the IT rack of FIG. 1.
Figure 1B:
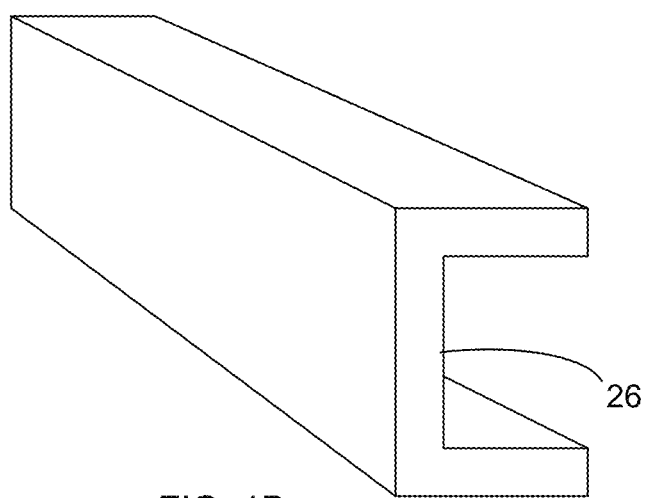

Oftentimes, positioned between NEMA rails 14, 16 and the IT device (e.g., IT computing device 12) are track assemblies (e.g., track assemblies 20, 22) that may allow IT computing device 12 to slide into and out of IT rack 10. Examples of track assemblies 20, 22 may include "L" track assembly 24 (e.g., a track assembly that has a general "L" shape, as shown in FIG. 1A) and "C" track assembly 26 (e.g., a track assembly that has a generally "C" shaped profile, as shown in FIG. 1B).

Figure 2:
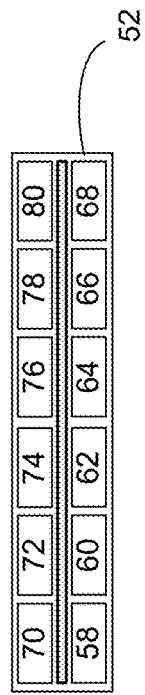
FIG. 2 is a diagrammatic view of an IT computing device for use within the IT rack of FIG. 1.
Figure 2:
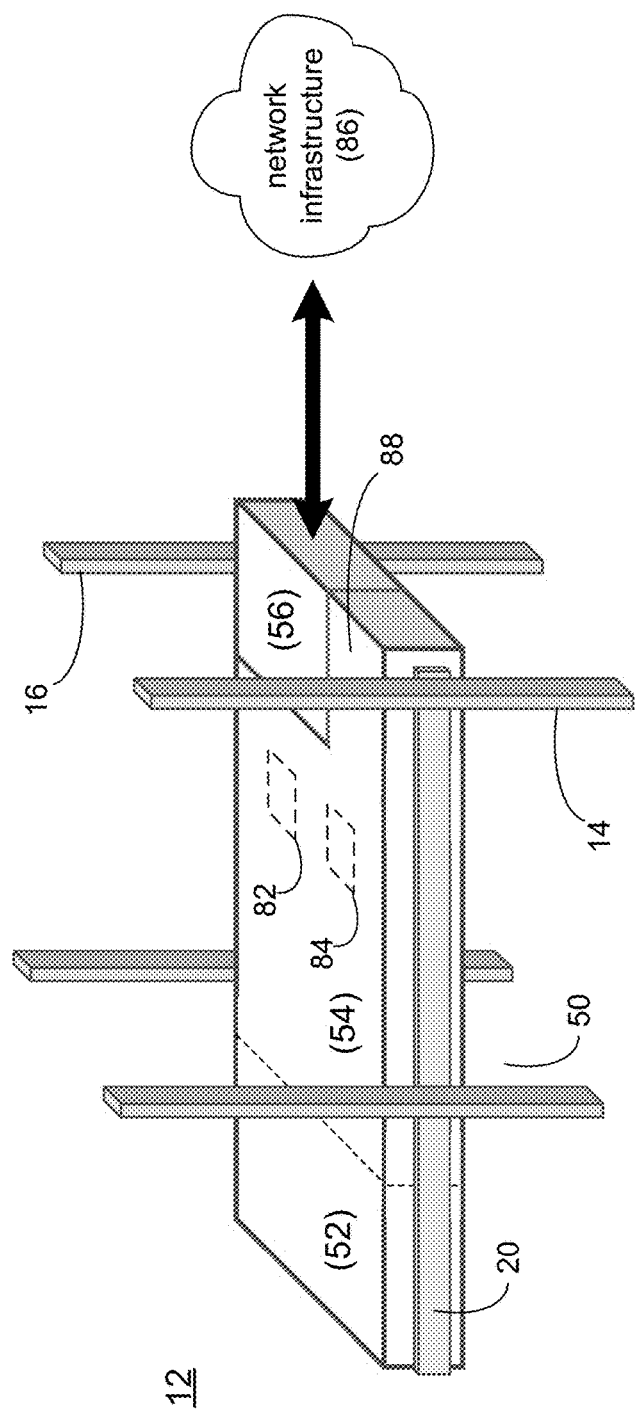

Referring to FIG. 2, there is shown one example of IT computing device 12. In this particular embodiment, IT computing device 12 is shown to include chassis 50, wherein chassis 50 may include a plurality of individual components, examples of which may include but are not limited to storage component 52 and processing component 54. IO subsystem 56 may be configured to be releasably coupleable to chassis 50.

Storage component 52 may be the portion of IT computing device 12 that is configured to store data. Examples of such data may include but are not limited to data that is generated remotely (e.g., by applications that are executed on remote devices) or data that is generated locally (e.g., by applications that are executed on IT computing device 12). Accordingly, storage component 52 may be configured to include one or more storage devices, examples of which may include but are not limited to one or more rotating-media hard disk drives (e.g., SATA drives or SCSI drives) and/or one or more solid state storage devices (e.g., flash drives). For example and as shown in FIG. 2A, storage component 52 (when in a 2U configuration) may be configured to include twelve 2.5 inch form factor storage devices (e.g., storage devices 58, 60, 62, 64, 66, 68, 70, 72, 74, 76, 78, 80).

Processing component 54 may be the portion of IT computing device 12 that is configured to process data, such as data that is generated remotely (e.g., by applications that are executed on remote devices) or data that is generated locally (e.g., by applications that are executed on IT computing device 12). Accordingly, processing component 54 may be configured to include one or more microprocessors (e.g., microprocessors 82, 84).

IO subsystem 56 may be configured to couple IT computing device 12 to a network infrastructure (e.g., network infrastructure 86), wherein network infrastructure 86 may be configured to couple IT computing device 12 to other IT computing devices (e.g., server systems, disk array systems, storage processor systems, storage processor/disk systems, and battery backup systems), other networking devices (e.g., switches, routers, bridges, wireless access points), and/or other end user computing devices (e.g., desktop computers, laptop computers, notebook computers, smartphones, tablet computers, etc.). Examples of network infrastructure 86 may include but are not limited to an Ethernet infrastructure; a fiber channel infrastructure; and an infiniband infrastructure.

IT computing device 12 may include power supply component 88 positioned proximate IO subsystem 56 (as opposed to being a portion of IO subsystem 56), thus allowing IO subsystem 56 to be decoupled from IT computing device 12 without needing to disconnect IT computing device 12 from its power source (not shown).

Through the use of IO subsystem 56, IT computing device 12 may be more easily modified and/or adapted for future use. Specifically and as discussed above, IO subsystem 56 may be configured to be releasably coupleable to chassis 50, thus allowing for variants of IO subsystem 56 to be utilized in the future in the event that e.g., the configuration of IT computing device 12 needs to be updated/changed.

Figure 3:
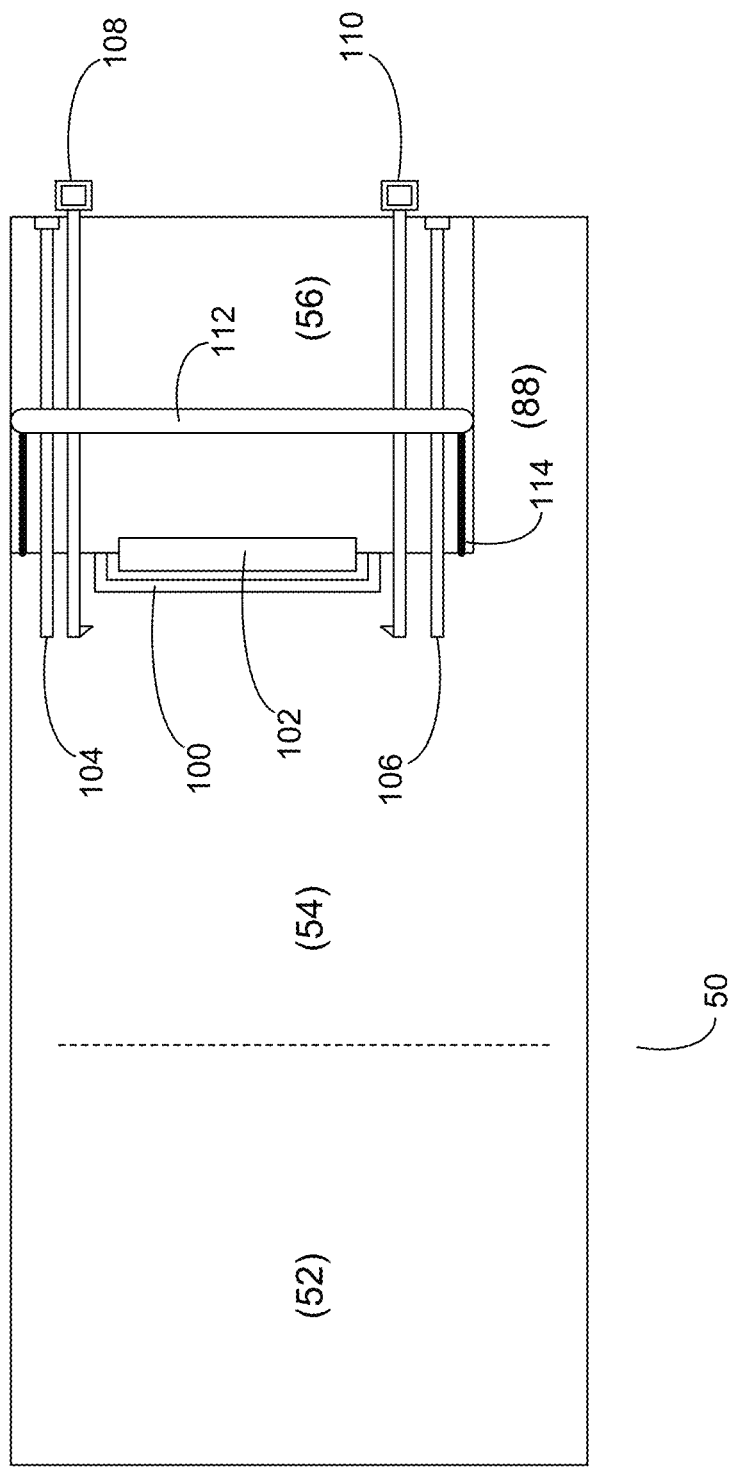
FIG. 3 is a diagrammatic view of the IT computing device of FIG. 2 including a coupling system.

For example and referring also to FIG. 3, chassis 50 (which, as discussed above, includes storage component 52 and processing component 54) may contain one or more electrical connector assemblies and alignment assemblies (e.g., alignment pins) to enable e.g., chassis 50 to releasably couple (both electrically and mechanically) IO subsystem 56. Specifically and in the following illustrative example, chassis 50 may include female electrical connector assembly 100 that is configured to releasably couple male electrical connector assembly 102 included within IO subsystem 56. Electrical connector assemblies 100, 102 may be configured and sized to accommodate the required number of electrical signals passing between chassis 50 and IO subsystem 56. Examples of electrical connector assemblies 100, 102 may include but are not limited to one or more PCIe electrical connector assemblies and/or any other custom or generic electrical connector assemblies.

IO subsystem 56 may include a coupling system configured to releasably couple IO subsystem 56 and chassis 50 together. Examples of such a coupling system may include but are not limited to one or more screw assemblies (e.g., screw assemblies 104, 106), one or more latching assemblies (e.g., latching assemblies 108, 110), and/or one or more lever assemblies (e.g., lever assembly 112). Specifically, screw assemblies 104, 106 and/or latching assemblies 108, 110 may be configured to releasably couple chassis 50 and IO subsystem 56 together. Further, lever assembly 112 may be configured to pivot about point 114 to engage/disengage IO subsystem 56 and chassis 50.

Figure 4:
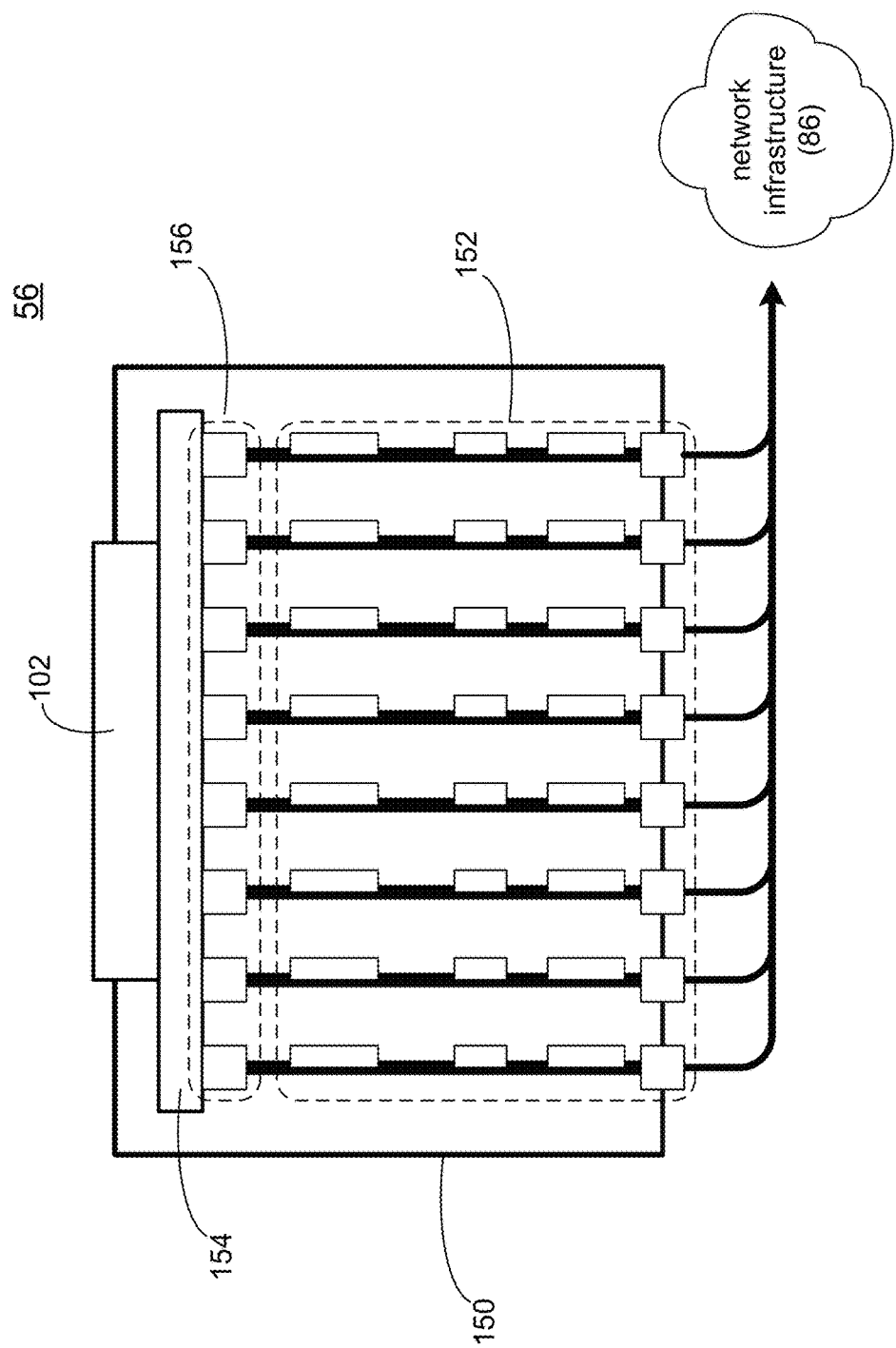
FIG. 4 is a diagrammatic view of an IO subsystem for use with the IT computing device of FIG. 2.
Figure 5:
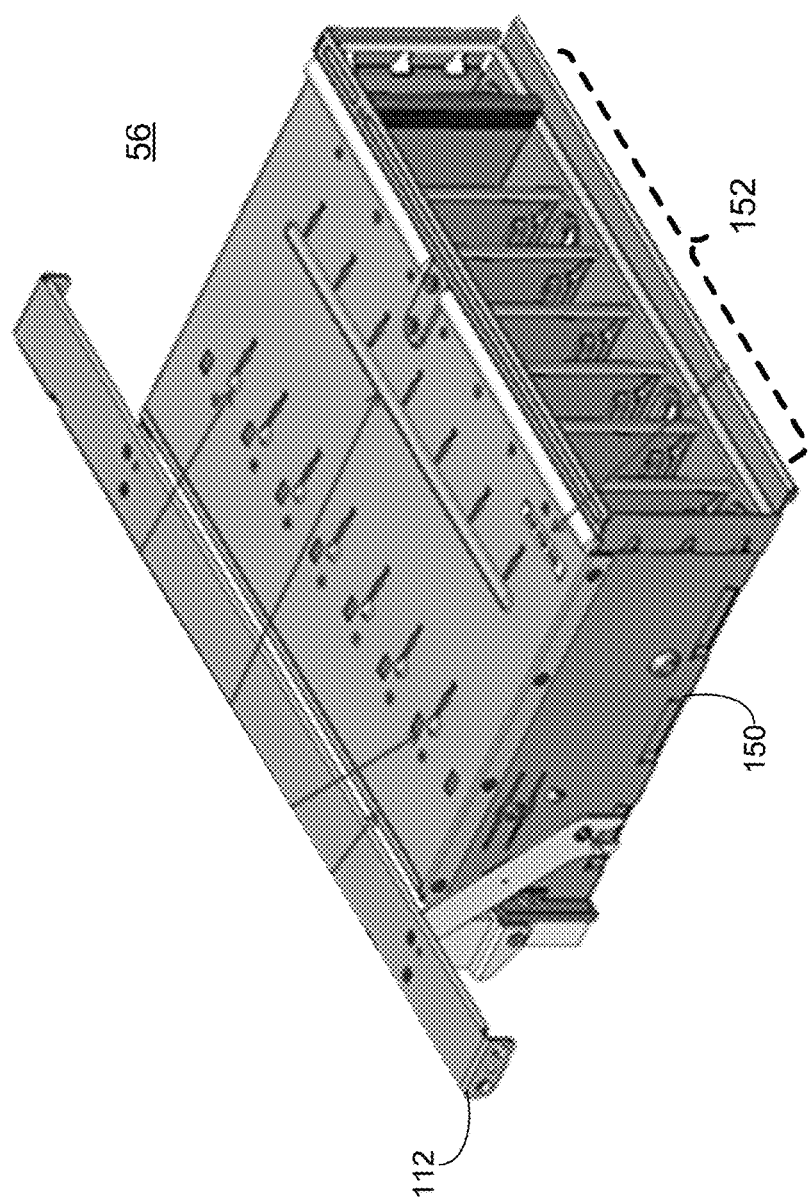
FIG. 5 is another diagrammatic view of the IO subsystem of FIG. 4.

Referring also to FIGS. 4-5, there is shown detail diagrammatic views of IO subsystem 56. IO subsystem 56 may include cage assembly 150 configured to releasably engage chassis 50 of IT computing device 12 and to receive a plurality of IO adapter cards (e.g., plurality of IO adapter cards 152). IO subsystem 56 may include midplane adapter assembly 154, such as a circuit board positioned within cage assembly 150, that includes a first electrical connector system (e.g., male electrical connector assembly 102) configured to engage a generic connector system (e.g., female electrical connector assembly 100) included within IT computing device 12 (and chassis 50). Midplane adapter assembly 154 may also include second electrical connector system 156 (e.g., a plurality of card edge connectors) configured to engage plurality of IO adapter cards 152. Examples of IO adapter cards 152 may include but are not limited to one or more SLIC adapter cards produced by EMC of Hopkinton, Mass. and/or one or more traditional host bus adapter (HBA) cards. As discussed above, IO subsystem 56 may be configured to couple IT computing device 12 to network infrastructure 86. Accordingly, each of plurality of IO adapter cards 152 may be coupled to network infrastructure 86.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. An IO subsystem, for use with an IT computing device, comprising:
   a cage assembly configured to releasably engage a chassis of the IT computing device and to receive a plurality of IO adapter cards;
   a midplane adapter assembly, positioned within the cage assembly, and including a first electrical connector system configured to engage a generic connector system included within the IT computing device and a second electrical connector system configured to engage the plurality of IO adapter cards; and
   a coupling system configured to releasably couple the cage assembly to the chassis of the IT computing device, wherein the coupling system includes a lever assembly pivotably fixed to opposite sides of the cage assembly and configured to engage the cage assembly to the chassis of the IT computing device and disengage the cage assembly from the chassis of the IT computing device;
   wherein the chassis of the IT computing device and the cage assembly are configured to be positioned on a pair of track assemblies of an IT rack; and
   wherein the chassis of IT computing device includes:
      a processing component configured to include one or more microprocessors, and
      a storage component configured to include one or more storage devices.

2. The IO subsystem of claim 1 wherein the coupling system includes one or more screw assemblies.

3. The IO subsystem of claim 1 wherein the coupling system includes one or more latching assemblies.

4. The IO subsystem of claim 1 wherein the IO subsystem is configured to couple the IT computing device to a network infrastructure.

5. The IO subsystem of claim 4 wherein the network infrastructure includes one or more of:
   an Ethernet infrastructure;
   a fiber channel infrastructure; and
   an infiniband infrastructure.

6. The IO subsystem of claim 1 wherein the one or more storage devices includes at least one hard disk drive.

7. The IO subsystem of claim 1 wherein the one or more storage devices includes at least one solid state storage device.

8. The IO subsystem of claim 1 wherein the IT computing device is a 2U IT computing device.

9. An IO subsystem, for use with an IT computing device, comprising:
   a cage assembly configured to releasably engage a chassis of the IT computing device and to receive a plurality of IO adapter cards;
   a midplane adapter assembly, positioned within the cage assembly, and including a first electrical connector system configured to engage a generic connector system included within the IT computing device and a second electrical connector system configured to engage the plurality of IO adapter cards; and
   a coupling system configured to releasably couple the cage assembly to the chassis of the IT computing device, wherein the coupling system includes a lever assembly pivotably fixed to opposite sides of the cage assembly and configured to engage the cage assembly to the chassis of the IT computing device and disengage the cage assembly from the chassis of the IT computing device;
   wherein the IO subsystem is configured to couple the IT computing device to a network infrastructure, including one or more of an Ethernet infrastructure, a fiber channel infrastructure, and an infiniband infrastructure;
   wherein the chassis of the IT computing device and the cage assembly are configured to be positioned on a pair of track assemblies of an IT rack; and
   wherein the chassis of IT computing device includes:
      a processing component configured to include one or more microprocessors, and
      a storage component configured to include one or more storage devices.

10. The IO subsystem of claim 9 wherein the coupling system includes one or more screw assemblies.

11. The IO subsystem of claim 9 wherein the coupling system includes one or more latching assemblies.

12. An IO subsystem, for use with an IT computing device, comprising:
   a cage assembly configured to releasably engage a chassis of the IT computing device and to receive a plurality of IO adapter cards;
   a midplane adapter assembly, positioned within the cage assembly, and including a first electrical connector system configured to engage a generic connector system included within the IT computing device and a second electrical connector system configured to engage the plurality of IO adapter cards; and a coupling system configured to releasably couple the cage assembly to the chassis of the IT computing device, wherein the coupling system includes a lever assembly pivotably fixed to opposite sides of the cage assembly and configured to engage the cage assembly to the chassis of the IT computing device and disengage the cage assembly from the chassis of the IT computing device;

wherein the chassis of the IT computing device and the cage assembly are configured to be positioned on a pair of track assemblies of an IT rack; and wherein the IT computing device includes:
- a processing component configured to include one or more microprocessors,
- a storage component configured to include one or more storage devices, and
- a power supply component configured to be coupled to the IO subsystem via the first electrical system,
- wherein each of the processing component and the storage component are included within the chassis of the IT computing device.

13. The IO subsystem of claim 12 wherein the one or more storage devices includes at least one hard disk drive.

14. The IO subsystem of claim 12 wherein the one or more storage devices includes at least one solid state storage device.

* * * * *